United States Patent [19]

Haynes

[11] 4,032,973
[45] June 28, 1977

[54] POSITIVE FEEDBACK HIGH GAIN AGC AMPLIFIER

[75] Inventor: William P. Haynes, Bedford, Mass.

[73] Assignee: GTE Laboratories Incorporated, Waltham, Mass.

[22] Filed: May 7, 1976

[21] Appl. No.: 684,209

[52] U.S. Cl. .................................. 358/176; 330/20
[51] Int. Cl.² ...................... H04N 5/56; H03F 3/68
[58] Field of Search ............... 358/176, 177, 178; 325/411, 415, 319; 330/20, 22, 25, 26; 307/235 A, 235 E, 235 R

[56] References Cited

UNITED STATES PATENTS 3,691,465  9/1972  McFadyen .................... 325/411
3,825,849  7/1974  Linder ............................ 330/20

Primary Examiner—John C. Martin
Attorney, Agent, or Firm—Irving M. Kriegsman; Leslie J. Hart

[57] ABSTRACT

An automatic gain control circuit provides a high gain signal representative of the difference in amplitude between the synchronizing pulses of a composite video signal and a predetermined reference level. A common emitter transistor provides high gain amplification of the composite video signal, the emitter of this transistor being biased at the reference level via a voltage reference source. The collector of this transistor is coupled to an emitter follower transistor whose output signal is filtered to produce the gain control signal. A controlled positive feedback signal from the emitter of the second transistor amplifier is coupled to the emitter of the first transistor amplifier, and by matching the feedback resistor to the collector bias resistor of the common emitter transistor, the emitter of this transistor is at a virtual ground thereby providing a high gain.

5 Claims, 3 Drawing Figures

POSITIVE FEEDBACK HIGH GAIN AGC AMPLIFIER

CROSS-REFERENCE TO OTHER APPLICATIONS

A concurrently filed application entitled "Noise Suppression Circuit" bearing Ser. No. 684,245, being filed in the name of Arthur H. Klein, and being assigned to GTE Sylvania, Incorporated describes and claims a noise suppression circuit for detecting and removing noise within a gain-controlled composite video signal. Also a concurrently filed application entitled "Bias Gate for Noise Suppression Circuit" bearing Ser. No. 684,210, being filed in the name of William Haynes, and being assigned to GTE Laboratories, Incorporated describes and claims a circuit for increasing the noise detection level during the intervals of the synchronizing pulses within a gain-controlled composite video signal.

BACKGROUND OF THE INVENTION

The present invention relates to an automatic gain control (AGC) circuit for providing a gain control signal to a gain controlled signal receiver of a television receiver.

In typical television receivers, a radio frequency (RF) modulated television signal is received and processed, i.e., amplified, filtered, and demodulated to provide a composite video signal. The composite video signal contains video information which is utilized to modulate an electron beam or beams in a cathode ray tube and sychronizing information to synchronize the scanning of electron beams of the cathode ray tube with the video information to create a coherent display. The synchronizing information is in the form of synchronizing pulses which extend beyond the black level of the composite video signal and which occur during the vertical and horizontal retrace or blanking intervals.

Television receivers also include an automatic gain control circuit which detects the amplitude of the synchronizing pulses in the composite video signal and adjusts the gain of the signal receiver amplifiers in response thereto. For optimum operation, the AGC circuit should have a high gain, such as in the range of about 500. While AGC circuits using various prior art techniques have been developed and operate more or less satisfactorily, they suffer from one or more various disadvantages. For example, one known circuit utilizes a discrete device common emitter transistor stage with an emitter by-pass capacitor to achieve the desired high gain. Another circuit uses differential amplifiers for integrated circuit operation but these amplifiers do not realize the necessary high gains without the use of active loads which increases the complexity of the circuit. Thus, these and other circuits or techniques do not lend themselves to fabrication in integrated circuit form in a cost effective manner.

SUMMARY OF THE INVENTION

Accordingly, it is an object of the present invention to provide an automatic gain control circuit which can be readily fabricated in integrated circuit form to maximize the available gain while still minimizing the total number of components necessary for maximum cost effectiveness.

It is an additional object of the present invention to provide a high gain common emitter amplifier which does not require an emitter by-pass capacitor to achieve the necessary gain.

According to the invention, in a television receiver having a gain controlled signal receiver for providing a composite video signal, there is provided an automatic gain control circuit for providing a gain control signal to the signal receiver. The circuit has a voltage reference source for providing a voltage representative of a predetermined level at which the synchronizing pulses of the composite video signal are to be controlled. A first amplifier which is responsive to a signal related to the composite video signal amplifies the composite video signal. The first amplifier has a transistor in a common emitter configuration with the voltage reference source being coupled to the emitter of the transistor. Accordingly, the collector of the first transistor provides an output signal representative of the amplified difference between the synchronizing pulse amplitude and the predetermined level. A second amplifier which is responsive to the output of the first amplifier provides current amplification of the composite video signal. The second amplifier includes a transistor in an emitter follower configuration. According to the invention, controlled positive feedback couples a portion of the output of the second transistor to the first amplifier to establish a virtual ground at the emitter of the first transistor. By this arrangement, a virtual ground is established at the emitter of the first transistor without the need for an emitter by-pass capacitor. A filtering device is coupled to the output of the second amplifier to produce the gain control signal. Controlled positive feedback is obtained by accurately matching the collector biasing resistor of the first transistor to the feedback resistor coupled between the emitters of the two transistors and by making the values of these resistors substantially greater than the value of the internal resistance of the voltage reference source.

For a better understanding of the present invention, together with other and further objects, advantages and capabilities, reference is made to the following disclosure in conjunction with the accompanying drawings.

DESCRIPTION OF PREFERRED EMBODIMENT

Figure 1:
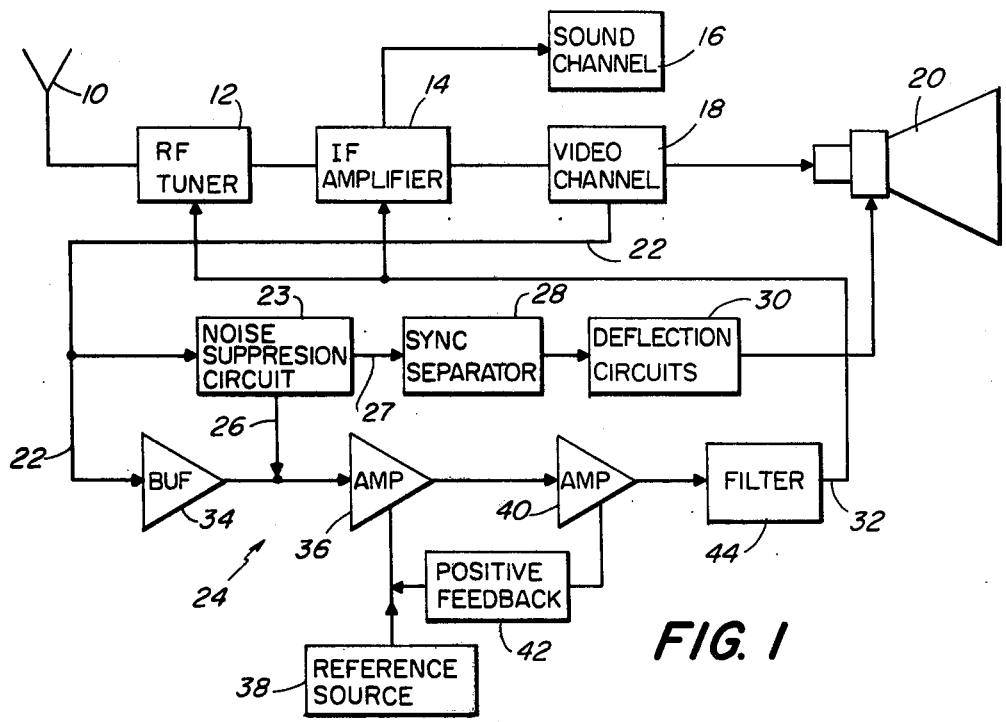
FIG. 1 is a block diagram of the major components of a television receiver utilizing an automatic gain control circuit in accordance with the present invention.

In FIG. 1, a television signal receiving device, such as an antenna 10, receives and couples a radio frequency (RF) modulated composite video signal to an RF tuner 12 which heterodynes the received signal to a suitable intermediate frequency (IF). The IF signal is coupled to an IF amplifier 14 which amplifies the IF signal. The audio portion of the received signal is coupled from the IF amplifier 14 to a sound channel 16. The video portion of the IF signal is coupled from the IF amplifier 14 to a video channel 18 wherein the IF signal is demodulated to provide a composite video signal. The composite video signal is processed in the video channel 18 to provide one or more signals to the electrodes of a cathode ray tube (CRT) 20.

Since the invention is useable in both monochrome and color television receivers, video channel 18 may be the video circuits of a conventional monochrome receiver or can include both luminance or chrominance circuitry of the type found in color television receivers. RF tuner 12, IF amplifier 14 and video channel 18 in general comprise a gain controlled signal receiver for providing a composite video signal. One or more amplifier stages in RF tuner 12 and IF amplifier 14 are typically gain controlled in accordance with a gain control signal derived from the synchronizing pulse amplitude of the composite video signal.

The video channel 18 has an output 22 at which the composite video signal is provided. The output 22 is in turn coupled to a noise suppression circuit 23 and to an automatic gain control circuit, represented generally by the reference numeral 24. One purpose of the noise suppression circuit 23 is to detect the presence of noise on the composite video signal and to provide a signal at 26 to the gain control amplifier 24 for cancelling the noise pulses which may be present on the composite video signal. Another output 27 of the noise suppression circuit 23 is in turn coupled to a sync separator 28 which removes the synchronizing pulses from the composite video signal. The previously identified application by Arthur H. Klein describes the details of a noise suppression circuit 23 and a sync separator 28 which may be suitably utilized with the AGC circuit of the present invention. The synchronizing pulses are then coupled to vertical and horizontal deflection circuits 30 which provide suitable vertical and horizontal scanning signals to a deflection yoke 31 associated with the CRT 20.

According to the invention, the automatic gain control circuit 24 receives the composite video signal from the gain controlled signal receiver and provides a gain control signal at an output 32 to the RF tuner 12 and the IF amplifier 14 of the gain controlled signal receiver. A buffer amplifier 34 receives the composite video signal and provides an output signal related to the composite video signal. This signal is combined with the output of the noise suppression circuit 23 to provide a noise-free input signal for a first amplifier 36. A reference source 38 provides a voltage representative of a predetermined level at which the synchronizing pulses of the composite video signal are to be controlled. The output of the amplifier 36 is representative of the amplified difference between the synchronizing pulse amplitude and the predetermined reference voltage level. This amplified output is in turn coupled to a second amplifier 40 which provides current amplification of the composite video signal. A positive feedback network 42 couples a portion of the output of the second amplifier 40 to the first amplifier 36. A filter 44 is coupled in the path of the output of the amplifier 40 to produce the gain control signal.

Figure 2:
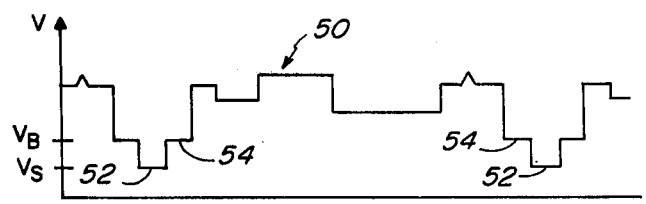
FIG. 2 is a waveform diagram of a composite video signal.

FIG. 2 is a waveform diagram of the composite video signal which is represented generally by the reference numeral 50. Video signal 50 has synchronizing pulses 52 with video information between the snychronizing pulses. The synchronizing pulses 52 ride on blanking pulses 54. The synchronizing pulses are shown as negative going and having a voltage level Vs and the blanking pulses have a voltage level $V_B$. The purpose of the circuit 24 is to maintain Vs equal to the predetermined reference level, designated $V_R$.

Figure 3:
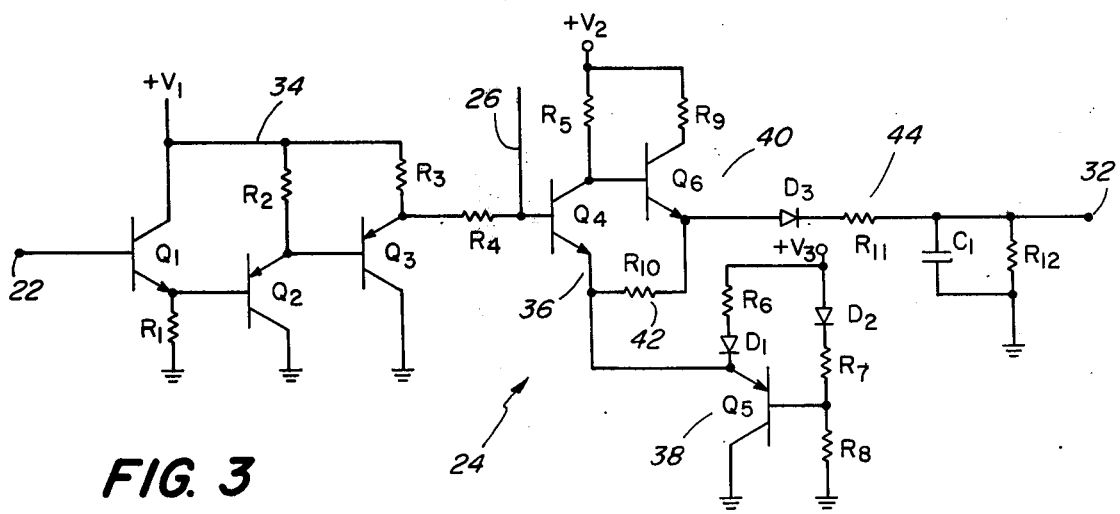
FIG. 3 is a schematic diagram of a preferred embodiment of the automatic gain control circuit according to the present invention.

FIG. 3 is a schematic diagram of a preferred embodiment of the automatic gain control circuit 24. The buffer 34 includes a transistor Q1 which has a base connected to the output 22 of the video channel 18, an emitter connected via a resistor R1 to circuit ground, and a collector connected to a voltage source $+V_1$. The emitter of transistor Q1 is further connected to a base of a transistor Q2 which has a collector connected to circuit ground and an emitter connected by a resistor R2 to the source $+V_1$. The emitter of transistor Q2 is further connected to a transistor Q3 which has a collector connected to circuit ground and an emitter connected by a resistor R3 to the source $+V_1$. The emitter of transistor Q3 is further connected by a resistor R4 to the input of the amplifier 36. One purpose of the unity gain buffer 34 is to isolate the composite video signal at 22 from the remaining portion of the gain control circuit 24. In addition, the use of three transistor emitter follower stages provides a means of making the synchronizing pulses at the output of the buffer differ from the reference level $V_R$ by one forward bias voltage drop across the base to emitter terminals of the first transistor in the amplifier 36. Accordingly, the output of the buffer 34 is related to the composite video signal. This output signal is combined with the signal at 26 which removes noise from the signal serving as the input to the AGC amplifier.

The amplifier 36 includes a transistor Q4 in a common emitter configuration in which the base is coupled to the output of the buffer 34, the emitter is coupled to the reference source 38 and the collector is coupled by a resistor R5 to a voltage source $+V_2$. The reference source 38 provides a voltage $V_R$ representative of a predetermined level at which the synchronizing pulses of the composite signal are to be controlled. Preferably, although not necessarily, this source is a buffered resistor divider stage. The source has a transistor Q5 whose collector is coupled to circuit ground, whose emitter is coupled via the series connection of a diode D1 and a resistor R6 to a voltage source $+V_3$ and whose base is coupled to the voltage divider network, comprising a diode D2 and resistors R7 and R8, coupled between circuit ground and the source $+V_3$. This circuit is the equivalent of a voltage source $V_R$ with reference to FIG. 2 with a finite, series coupled, internal resistance. The output of the source is taken from the emitter of the transistor Q5 and is coupled to the emitter of the transistor Q4.

The amplifier 40 comprises a transistor Q6 coupled in a emitter follower configuration wherein the base is coupled to the output of the amplifier 36, whose collector is coupled by a resistor R9 to the voltage source $+V_2$ and whose emitter is coupled to the filter 44. The resistor R9 limits the current in the collector of Q6. The positive feedback network 42 comprises a resistor R10 coupled between the emitters of transistors Q4 and Q6. Filter 44 includes a diode D2 in series with a resistor R11 and the parallel combination of a capacitor C1 and a resistor C12 coupled between output terminal 32 and circuit ground.

The automatic gain control circuit 24 operates in such a fashion as to maintain a constant current into the reference source 38, thereby minimizing the effect of the source having an internal resistance. When the transistor Q4 is cutoff, the total current into the reference source is $(V_{out}-V_e)/R10$ where $V_{out}$ is the emitter voltage of transistor Q6 and $V_e$ is the emitter voltage of transistor Q4. When an input voltage at the base of transistor Q4 is applied sufficient to change the output of Q4 by $V_{DEL}$ volts, the total current into the reference source becomes the sum of the emitter current of Q4 and the feedback current through R10 which is $V_{DEL}/R5 + (V_{out} - V_e - V_{DEL})/R10$. When R5 and R10 are matched, this relationship becomes $(V_{out} - V_e)R10$. Thus, the voltage at the emitter of transistor Q4 remains constant, and accordingly, a virtual ground is established. The current gain is approximately equal to $R5/Re4$ where $Re4$ represents the intrinsic and bulk effects of Q4's emitter. A more exact analysis, including loading effects and finite transistor current gain, shows a feedback of 98 to 99% which reduces the effect of the internal resistance of the reference source ($R_{e5}$) by a factor of 50 to 100.

The following describes the dynamic operation of the circuit. Assume first that the strength of the composite video signal decreases which causes the synchronizing pulses to become less negative going or, stated differently, to become more positive with respect to zero volts. As a result, Q4 increases conduction during synchronizing pulse intervals which decreases Q4's collector voltage. As a consequence, Q6 decreases conduction which decreases the output voltage. This decrease output voltage increases the gain of the amplifying circuitry of the gain controlled signal receiver. Assume now that the strength of the composite video signal increases which causes the synchronizing pulses to become more negative going or, stated differently, to become closer to zero volts. As a result, Q4 decreases conduction which increases Q4's collector voltage. Accordingly, transistor Q6 increases conduction which increases the ouput voltage. This increased output voltage decreases the gain of the amplifying circuitry of the gain controlled signal receiver. During normal operation in which the synchronizing pulses are at the level of the reference source, not only the video information but also the blanking pulses at level $V_B$ in FIG. 2 are positive enough with respect to zero volts to drive transistor Q4 into saturation which causes the output voltage during these intervals to be at its lowest level.

The purpose of the filter is to increase this level during video information intervals to approximately the output level present during the intervals of the synchronizing pulses. This is accomplished as follows. During the synchronizing pulse intervals, the capacitor C1 is charged at a rate established by the time constant of R11 and C1. This time constant is such that C1 is substantially fully charged before the end of the synchronizing pulse interval. During the video information interval, capacitor C1, discharges through R12 at a much slower rate then its charging rate so that the output voltage is substantially constant throughout the picture line and at the level established during the sync pulse interval. R12 is greater than R11 to obtain the increased time constant. Diode D3 inhibits C1 from discharging via the AGC amplifier.

In summary, the circuit operates as a high gain linear amplifier for a small range above and below the level of $V_R$. For example, assume the following values for the circuit.

$V_R = +2$ volts
$+V_1 = +5.7$ volts
$+V_2 = +20.0$ volts
$+\overline{V}_3 = +5.7$ volts $V_{be} = .7$ volts
$R_5$ and $R_{10} = 15K$ ohms
$R_{e4} \approx 30$ ohms
$R_{e5} \approx 30$ ohms
gain (AGC circuit) $\approx 500$ Thus, a variation of the synchronizing pulses voltage from the nominal 2 volt level of 40 millivolts produces a variation in output voltage of about 18 volts.

The embodiment of the present invention is intended to be merely exemplarly and those skilled in the art shall be able to make numerous variations and modifications of it without departing from the spirit and scope of the present invention. All such variations and modifications are intended to be within the scope of the present invention as defined by the appended claims.

I claim:

1. In a television receiver having a gain controlled signal receiver for providing a composite video signal, an automatic gain control circuit for providing a gain control signal to the signal receiver comprising:
    a. a voltage reference source for providing a voltage representative of a predetermined level at which the synchronizing pulses of the composite video signal are to be controlled,
    b. first amplifier means responsive to a signal related to the composite video signal for amplifying the composite video signal, the first amplifier means having a first transistor in a common emitter configuration with the voltage reference source being coupled to the emitter of the first transistor so that the collector of the first transistor provides an output signal representative of the amplified difference between the synchronizing pulse amplitude and the predetermined level,
    c. second amplifier means responsive to the output of the first amplifier means for providing current amplification of the composite video signal, the second amplifier means having a second transistor in an emitter follower configuration,
    d. positive feedback means for coupling a portion of the output of the second transistor to the first amplifier to establish a virtual ground at the emitter of the first transistor, and
    e. filter means connected to the output of the second amplifier means to produce the gain control signal.

2. The circuit according to claim 1 further including buffer amplifier means coupled between the signal receiver and the first amplifier means for changing the amplitude of the synchronizing pulses of the composite video signal by an amount substantially equal to the forward-bias voltage drop across the base-emitter junction of the first transistor of the first amplifier means.

3. The circuit according to claim 1 wherein the positive feedback means includes a feedback resistor coupled between the emitters of the first and second transistors.

4. The circuit according to claim 3 wherein the first amplifier means includes a collector biasing resistor and wherein the biasing resistor and the feedback resistor have substantially equal values of resistance.

5. The circuit according to claim 4 wherein the resistance of the feedback resistor is substantially greater then the internal resistance of the voltage reference source.

* * * * *